US009853451B2

(12) United States Patent
Tenca et al.

(10) Patent No.: US 9,853,451 B2
(45) Date of Patent: Dec. 26, 2017

(54) DIRECT CURRENT POWER SYSTEM

(71) Applicant: GENERAL ELECTRIC COMPANY, Schenectady, NY (US)

(72) Inventors: Pierluigi Tenca, Munich (DE); Christof Martin Sihler, Karlsruhe (DE)

(73) Assignee: General Electric Company, Niskayuna, NY (US)

( * ) Notice: Subject to any disclaimer, the term of this patent is extended or adjusted under 35 U.S.C. 154(b) by 462 days.

(21) Appl. No.: 14/609,991

(22) Filed: Jan. 30, 2015

(65) Prior Publication Data

US 2016/0226251 A1   Aug. 4, 2016

(51) Int. Cl.
*H02H 7/26* (2006.01)
*H02J 1/10* (2006.01)
(Continued)

(52) U.S. Cl.
CPC ............. *H02J 3/381* (2013.01); *H02H 7/268* (2013.01); *H02J 1/10* (2013.01); *H03K 17/08* (2013.01);
(Continued)

(58) Field of Classification Search
CPC ........ H02H 3/087; H02H 3/202; H02H 7/268; H02J 3/381; H02J 3/38; H02J 1/10;
(Continued)

(56) References Cited

U.S. PATENT DOCUMENTS 4,520,279 A   5/1985   Glennon
4,979,068 A   12/1990  Sobhani et al.
(Continued)

FOREIGN PATENT DOCUMENTS

DE   102011083514 A1   3/2013
EP   0489945 A1   6/1992
(Continued)

OTHER PUBLICATIONS

D. Zhang et al., "Internal Fault Detection and Isolation for Paralleled Voltage Source Converters," IEEE 978-1-4673-0111-4, Power Electronics and Drive Systems Technology (PEDSTC), Feb. 15-16, 2012, pp. 833-839.
(Continued)

*Primary Examiner* — Ryan Johnson
(74) *Attorney, Agent, or Firm* — Nitin N. Joshi

(57) ABSTRACT

A direct current (DC) power system includes a plurality of energy sources supplying power to a plurality of loads via a DC bus having at least one positive rail. The DC bus includes two DC bus subsections and a DC bus separator coupled between the two DC bus subsections. The DC bus separator includes a controllable switch with at least one of its terminals coupled with a terminal of an inductor to provide a current path between the two DC bus subsections during normal operation via the inductor. The controllable switch is switched off to break the current path when a fault on the positive rail is detected. Furthermore, the DC bus separator includes a diode connected in parallel to the inductor and arranged to provide a circulating current path to dissipate an inductor current in the inductor when the controllable switch is switched off.

22 Claims, 4 Drawing Sheets

(51) Int. Cl.
*H02H 3/087* (2006.01)
*H02H 3/20* (2006.01)
*H02J 3/38* (2006.01)
*H03K 17/08* (2006.01)
*H03K 17/66* (2006.01)

(52) U.S. Cl.
CPC ............ *H02H 3/087* (2013.01); *H02H 3/202* (2013.01); *H03K 17/66* (2013.01)

(58) Field of Classification Search
CPC . H02J 1/108; H02J 1/12; H03K 17/08; H03K 17/66
See application file for complete search history.

(56) References Cited

U.S. PATENT DOCUMENTS

| | | | |
|---|---|---|---|
| 6,624,993 B1* | 9/2003 | Boenig | H02H 3/025 361/58 |
| 6,714,395 B2 | 3/2004 | Meisinger, Sr. et al. | |
| 8,743,514 B2 | 6/2014 | Sihler et al. | |
| 2003/0071633 A1 | 4/2003 | Fedirchuk et al. | |
| 2013/0188402 A1 | 7/2013 | Boe | |
| 2013/0286521 A1 | 10/2013 | Park | |
| 2014/0078622 A1 | 3/2014 | Crane | |
| 2014/0299579 A1 | 10/2014 | Hartmann et al. | |
| 2014/0361621 A1* | 12/2014 | Lindtjorn | H02H 7/268 307/38 |

FOREIGN PATENT DOCUMENTS

| | | |
|---|---|---|
| WO | 2011141052 A1 | 11/2011 |
| WO | 2011157305 A1 | 12/2011 |
| WO | 2013045238 A1 | 4/2013 |
| WO | 2013127438 A1 | 6/2013 |
| WO | 2013127575 A1 | 6/2013 |
| WO | 2013152799 A1 | 10/2013 |
| WO | 2014124660 A1 | 8/2014 |

OTHER PUBLICATIONS

G.P. Adam et al., "Network Fault Tolerant Voltage-Source-Converters for High-Voltage Applications," AC and DC Power Transmission, 2010, ACDC 9th IET Conference on Oct. 19-21, 2010. pp. 1-5.

European Search Report and Opinion issued in connection with corresponding EP Application No. 6152390.7-1806 dated Jul. 4, 2016.

* cited by examiner

DIRECT CURRENT POWER SYSTEM

BACKGROUND

The invention relates generally to power transmission and more specifically to a system and method for transmitting direct current electrical power to marine or subsea electrical equipment.

In the last few decades, the field of power conversion has grown tremendously due to its imminent advantages in motor drives, renewable energy systems, high voltage direct current (HVDC) systems, and the like. For example, a subsea oil and gas production system which requires hundreds of megawatts of electric power may employ a HVDC transmission and distribution system for delivery of electric power. Furthermore, in recent time, marine traffic has also increased substantially across the world due to tremendous rise in cargo transport vessels, warships, offshore oil ships, passenger ships etc. These vessels or ships have many electrical loads on board. Variable speed electric drives for pumps, fans, electric propulsion installations, lighting and air conditioning are some examples of the electrical loads on board of a ship.

Often subsea and marine power supply circuit arrangements include a direct current (DC) power system including a DC bus to which a plurality of power converters and a plurality of loads are connected. Power converters supply energy to the plurality of loads via the common DC bus. The common DC bus also includes a plurality of capacitors. Such a power system poses significant protection problems due to a large number of subsystems in the circuit. In many cases, the common DC bus itself may be divided in a plurality of subsections and the relevant subsections then further form subsystems. The protection problems are exacerbated by the subsea environment and the customer requests of system availability for several years without maintenance. It is therefore necessary to design the overall set of subsystems connected to the common DC bus in a way that limits the damages when even just one of the subsystem fails because of a short-circuit fault. The main problem is discharge of large quantity of energy accumulated in the capacitors that are connected to the common DC bus from one subsystem to another.

One solution to mitigate above problem is the use of varistors in combination with RC snubbers which are devoted to absorb the energy associated with the DC bus current when a controllable switch opens during the fault. However, many of these solutions involve utilizing a DC circuit breaker.

Therefore, there still exists a need for a compact and a reliable system for transmitting electric power to subsea or marine equipment.

BRIEF DESCRIPTION

In accordance with an embodiment of the present technique, a direct current power system is presented. The DC power system includes a plurality of energy sources supplying power to a plurality of loads and a common DC bus having at least one positive rail. The common DC bus is coupled between the plurality of energy sources and the plurality of loads. The common DC bus includes at least two DC bus subsections with DC power transfer capability therebetween and at least one DC bus separator coupled between the at least two DC bus subsections. The DC bus separator includes at least one positive rail controllable switch with at least one of its terminal coupled with at least one terminal of a positive rail inductor to provide a current path between the at least two DC bus subsections during normal operation via the positive rail inductor, wherein the at least one positive rail controllable switch is controlled to be switched off to break the current path when a fault on the positive rail is detected. Furthermore, the DC bus separator includes at least one positive rail diode connected in parallel to the at least one positive rail inductor and arranged to provide a circulating current path to dissipate an inductor current in the at least one positive rail inductor when the at least one positive rail controllable switch is switched off.

In accordance with another embodiment of the present technique, a method of supplying DC power is presented. The method includes providing a plurality of energy sources to supply DC power to a plurality of loads and coupling the plurality of energy sources and the plurality of loads by a common DC bus having at least one positive rail. Coupling the energy sources and the loads by the common DC bus includes providing at least two DC bus subsections with DC power transfer capability therebetween and coupling at least one DC bus separator between the at least two DC bus subsections. Coupling the at least on DC bus separator includes coupling at least one terminal of a positive rail to at least one terminal of a positive rail inductor to provide a current path between the at least two DC bus subsections during normal operation via the positive rail inductor. Furthermore, coupling the at least one DC bus separator includes controlling the at least one positive rail controllable switch to be switched off to break the current path when a fault on the positive rail is detected. Coupling the at least one DC bus separator also includes connecting at least one positive rail diode in parallel to the at least one positive rail inductor and arranged to provide a circulating current path to dissipate an inductor current in the at least one positive rail inductor when the at least one positive rail controllable switch is switched off.

DRAWINGS

DETAILED DESCRIPTION

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. Furthermore, the terms "circuit" and "circuitry" and "controller" may include either a single component or a plurality of components, which are either active and/or passive and are connected or otherwise coupled together to provide the described function.

Figure 1:
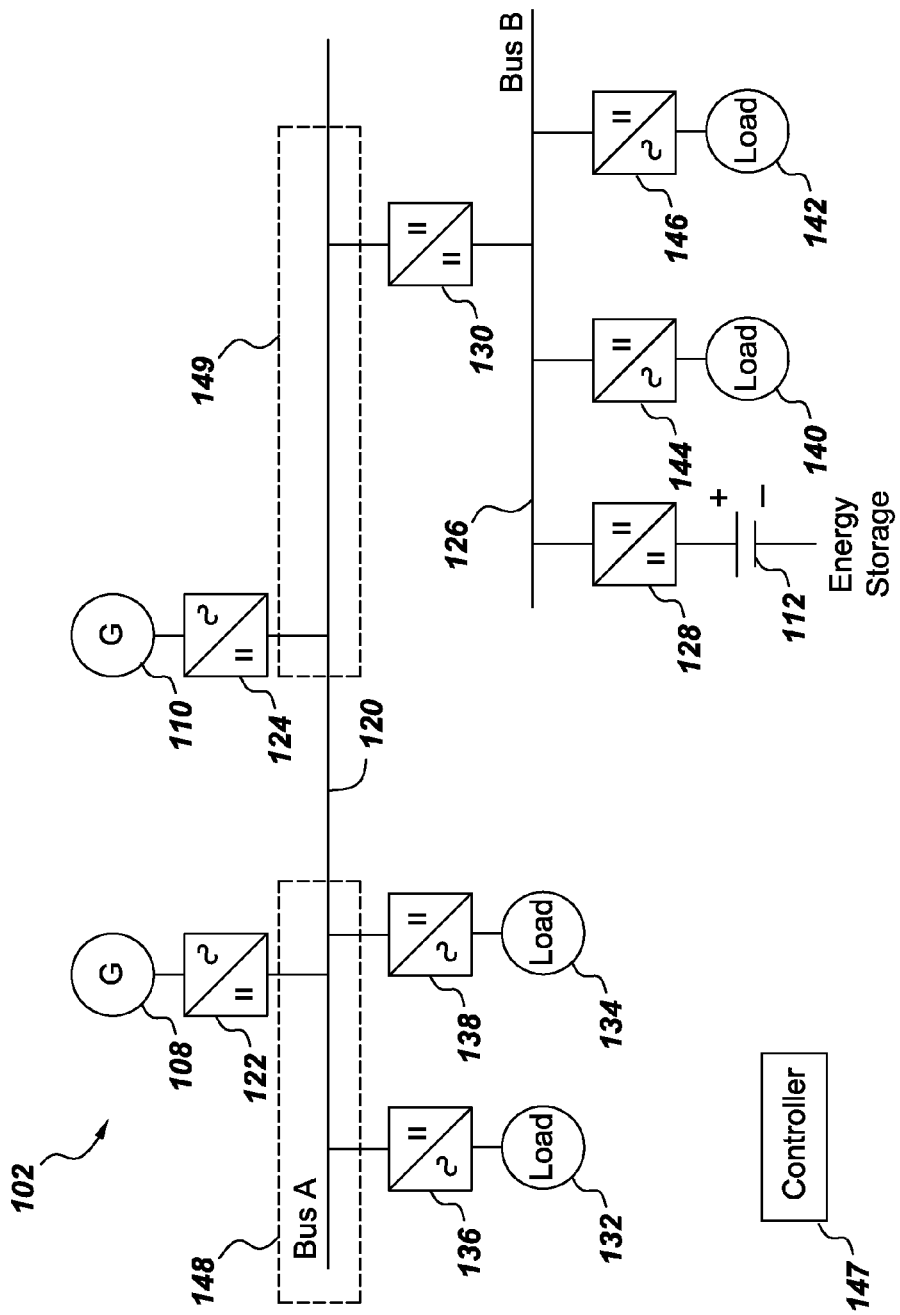
FIG. 1 is a diagrammatical representation of a prior art DC power system for a marine or subsea equipment.

Turning now to the drawings, by way of example in FIG. 1, a prior art DC power system 102 for a marine or subsea equipment is depicted. DC power system 102 includes energy sources such as alternating current (AC) generators 108, 110 which feed power to a DC bus 120 via power electronic converters 122 and 124 respectively. In one embodiment, for example for a subsea system, DC power system 102 may receive energy from a power grid (not shown) via a transmission line (not shown). In the embodiment shown DC power system 102 also includes an energy storage device 112 which feeds power to a DC bus 126 via a power electronic converter 128. Power electronic converters 122, 124 are AC to DC converters as they have to convert power from AC generators to the DC bus whereas power electronic converter 128 is a DC to DC converter as it couples a DC energy storages device to a DC bus. The two DC buses 120 and 126 do not have same DC voltage and hence are coupled to each other via a DC to DC converter 130. DC to DC converter 130 may be a bidirectional DC to DC converter or an unidirectional DC to DC converter. Further, loads 132 and 134 are connected to DC bus 120 via power electronic converters 136 and 138 respectively and loads 140 and 142 are connected to DC bus 122 via power electronic converters 144 and 146 respectively. Depending on whether the load is an AC load or a DC load, power electronic converter 136, 138, 144 and 146 may be AC to DC converters or DC to DC converters.

It should be noted that FIG. 1, is a single line diagram of DC power system 102. In other words, all converters have been shown to have only one input terminal and one output terminal for ease of explanation. However, a negative terminal or a reference terminal is always there at the input and the output of each of the converter. Similarly, DC bus 120 includes a positive rail and a negative rail but for ease of explanation only one line is shown.

DC power system 102 also includes a controller 147 to control various AC to DC converters and/or DC to DC converters. Furthermore, DC bus 120 includes two subsections, 148 and 149, respectively. If there is a short circuit fault on subsection 148 then loads and generators connected to subsection 149 will also get affected. Similarly, if there a short circuit fault on subsection 149, then loads and generators connected to subsection 148 will get affected. Therefore, in accordance with an embodiment of the present technique, a DC bus separator is presented which isolates a faulty DC bus subsection from a health DC bus subsection and allows continuity of operation of healthy DC bus subsection.

Figure 2:
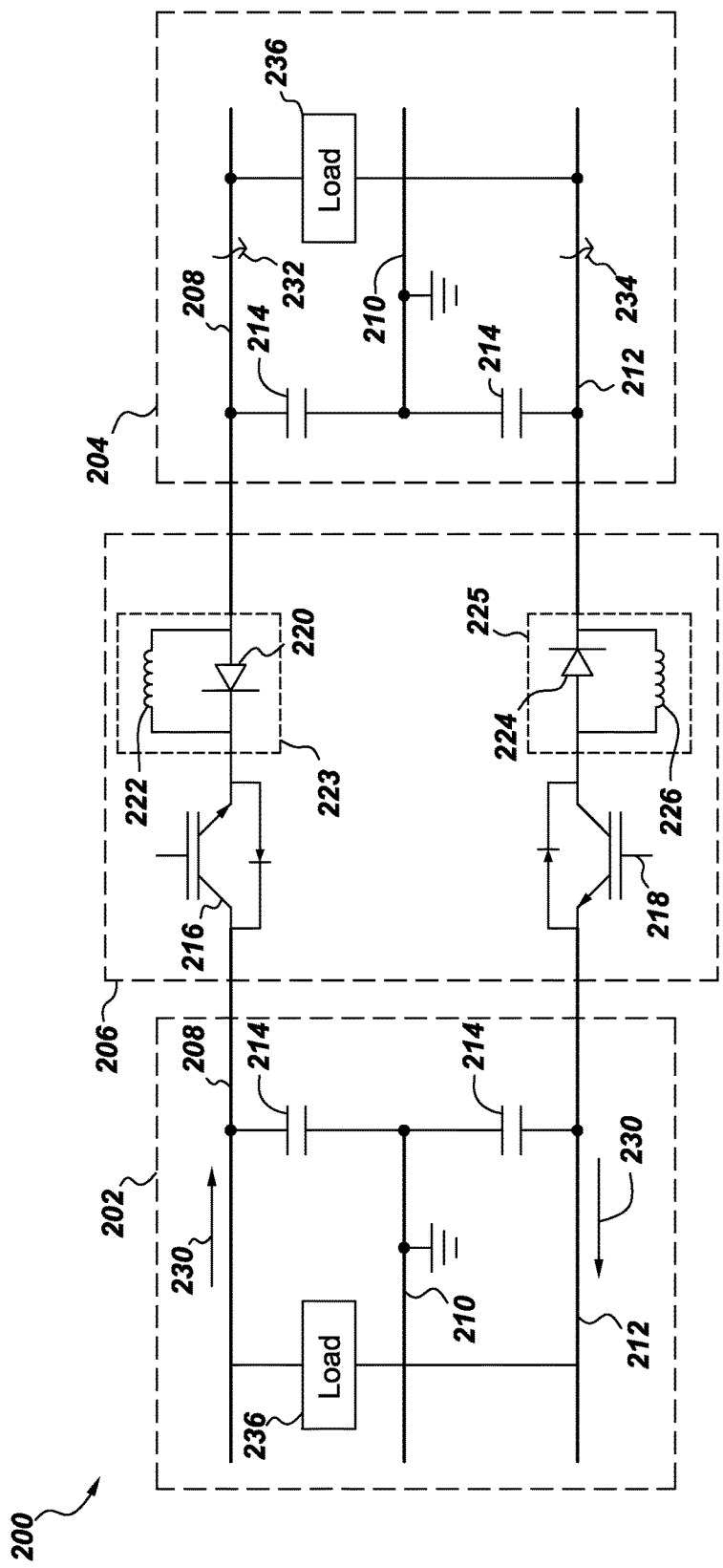
FIG. 2 is a schematic diagram illustrating a DC bus for use in a DC power system, in accordance with aspects of the present disclosure.

FIG. 2 illustrates a schematic diagram of a DC bus 200 for use in a DC power system in accordance with aspects of the present disclosure. DC bus 200 includes a positive rail 208, a negative rail 212 and a ground rail 210. Furthermore, DC bus 200 is split into two subsections 202 and 204. Subsection 202 and 204 are separated by a DC separator 206. DC bus 200 also includes a plurality of capacitors connected between the positive rail 208, the negative rail 212 and the ground rail 210. As discussed earlier, a plurality of loads (not shown) may be connected to DC bus 200. The loads 236 may be between the positive rail 208 and the negative rail 212 or the ground rail 210 and the negative rail 212 or between the positive rail 208 and the negative rail 212.

The DC bus 200 shown in FIG. 2 allows controlled separation of DC bus subsections when the DC power flow is unidirectional i.e., a DC power transfer from subsection 202 to subsection 204. However, the technique disclosed here is also applicable for a DC bus structure where controlled separation must be provided also with bidirectional power flow. When there is a short circuit fault on subsection 204, DC bus separator 206 isolates subsection 204 from subsection 202. In other words, when the fault occurs DC bus separator 206 blocks a DC bus current from subsection 202 to subsection 204.

DC bus separator 206 includes a positive rail controllable switch 216 and a negative rail controllable switch 218 connected in series with positive rail 208 and negative rail 212 respectively. DC bus separator 206 further includes a positive rail diode-inductor pair 223 in its positive rail 208 and a negative rail diode-inductor pair 225 in its negative rail 212. Positive rail diode-inductor pair 223 includes a diode 220 connected in parallel with a positive rail inductor 222. The positive rail diode-inductor pair 223 is then further connected to positive rail controllable switch 216. Positive rail controllable switch 216 is in series connection with positive rail inductor 222 and provides a current path between the at least two DC bus subsections 202, 204 during normal operation via the inductor. It should be noted here that the term 'series connection' refers to a physical connection between two elements i.e., they are connected one after another and one of the terminals of each element is coupled together. Furthermore, positive rail controllable switch 216 is controlled to be switched off to break the current path when a fault is detected on the DC bus subsection 202. In the embodiment shown, an anode of positive rail diode 220 is coupled to DC bus subsection 204 whereas the cathode is connected to controllable switch 216. Positive rail diode 220 connected in parallel to the positive rail inductor 222 provides a circulating current path to dissipate an inductor current in the positive rail inductor 222 when the positive rail controllable switch 216 is not conducting or is switched off due to a fault.

Similarly, negative rail diode-inductor pair 225 also includes a negative rail diode 224 connected in parallel with a negative rail inductor 226. In the embodiment shown, the cathode of the negative rail diode 224 is connected to the negative rail controllable switch 218 and the anode is connected to DC bus subsection 204. Negative rail controllable switch 218 provides a current path for a power flow between subsections 202 and 204 via negative rail inductor 226 during normal conditions. Further, negative rail controllable switch 218 is controlled to be switched off in case of a fault so as to break the current path between subsections 202 and 204. Negative rail diode 224 again provides a circulating current path to dissipate an inductor current in the negative rail inductor 226 when the negative rail controllable switch 218 is switched off due to a fault.

The controllable switches such as switches 216 and 218 may include switching devices based on semiconductor technology, such as an insulated gate bipolar transistor (IGBT), a metal oxide semiconductor field effect transistor (MOSFET), a field effect transistor (FET), a gate turn-off thyristor, an insulated gate commutated thyristor (IGCT), an injection enhanced gate transistor (IEGT), a silicon carbide based switch, a gallium nitride based switch, a gallium arsenide based switch, or equivalents thereof. Furthermore, controllable switches may include a plurality of switching devices connected in series or in parallel or combinations thereof.

As discussed earlier, DC bus 200 allows controlled separation when the DC power flow is unidirectional. Therefore, during normal operation the DC power flows from DC bus subsection 202 to DC bus subsection 204. The controllable switches 216 and 218 are switched on during normal operation and a DC bus current 230 from subsection 202 to subsection 204 flows from positive rail controllable switch 216 and positive rail inductor 222 in positive rail 208. Furthermore, the DC bus current 230 flows from negative rail inductor 226 and negative rail controllable switch 218 in negative rail 212. Diodes 220 and 224 are reverse biased because the DC bus current 230 cannot flow in them when it is positive as indicated in the figure.

When a short circuit fault 232 occurs on positive rail 208 in DC bus subsection 204, the DC bus current 230 begins to rise substantially and inductors 222 and 226 generate increased negative voltage across diodes 220 and 224. This results in positive rail diode 220 becoming even more reverse biased. Once the short circuit current or fault current is detected by a sensor (not shown), controller 147 (FIG. 1) switches off positive rail controllable switch 216 and isolates positive rail 208 of healthy DC bus subsection 202 from positive rail 208 of faulty DC bus subsection 204. In one embodiment, inductor 222 is designed to limit the current rate of raise in switch 216 so that even after the sensing and protection unavoidable delay, switch 216 can still be switched off safely i.e., below its maximum commutable current. Once the switch 216 is switched off, the current in inductor 222 starts decreasing which immediately generates forward voltage across diode 220 and the current then flows through diode 220 i.e., diode 220 acts as a freewheeling diode for the inductor current. Since diode 220 starts conducting any antiparallel diode across switch 216 does not conduct. Furthermore, since the inductor current receives a current path via diode 220, no significant overvoltage is generated across switch 216 and also switch 216 does not need large energy absorbers in parallel to it. The inductor current eventually extinguishes and diode 220 becomes reverse biased again, thereby assuring indefinite separation of positive rail 208 of DC bus subsection 202 from DC bus subsection 204 and thus, continuity of operation of DC bus subsection 202. It should be noted that even though positive rails 208 of DC bus subsection 202 and DC bus subsection 204 have been separated, negative rails 212 of subsections 202 and 204 are still coupled. Furthermore, loads connected between negative rail 212 and positive rail 210 of subsection 204 may still be operative at reduced voltage since the positive rail voltage drops to ground rail voltage because of the short circuit.

Now if a short circuit fault 234 also occurs on negative rail 212 in DC bus subsection 204, at first negative rail diode 224 becomes even more reverse biased and then once negative rail controllable switch 218 is switched off, negative rail diode 224 becomes forward biased and provides a freewheeling path for the inductor current of negative rail inductor 226. This separates the negative rail 212 in DC bus subsection 204 from the negative rail 212 in DC bus subsection 202. Eventually the inductor current extinguishes. Thus, DC bus subsection 202 continues to operate normally.

Figure 3:
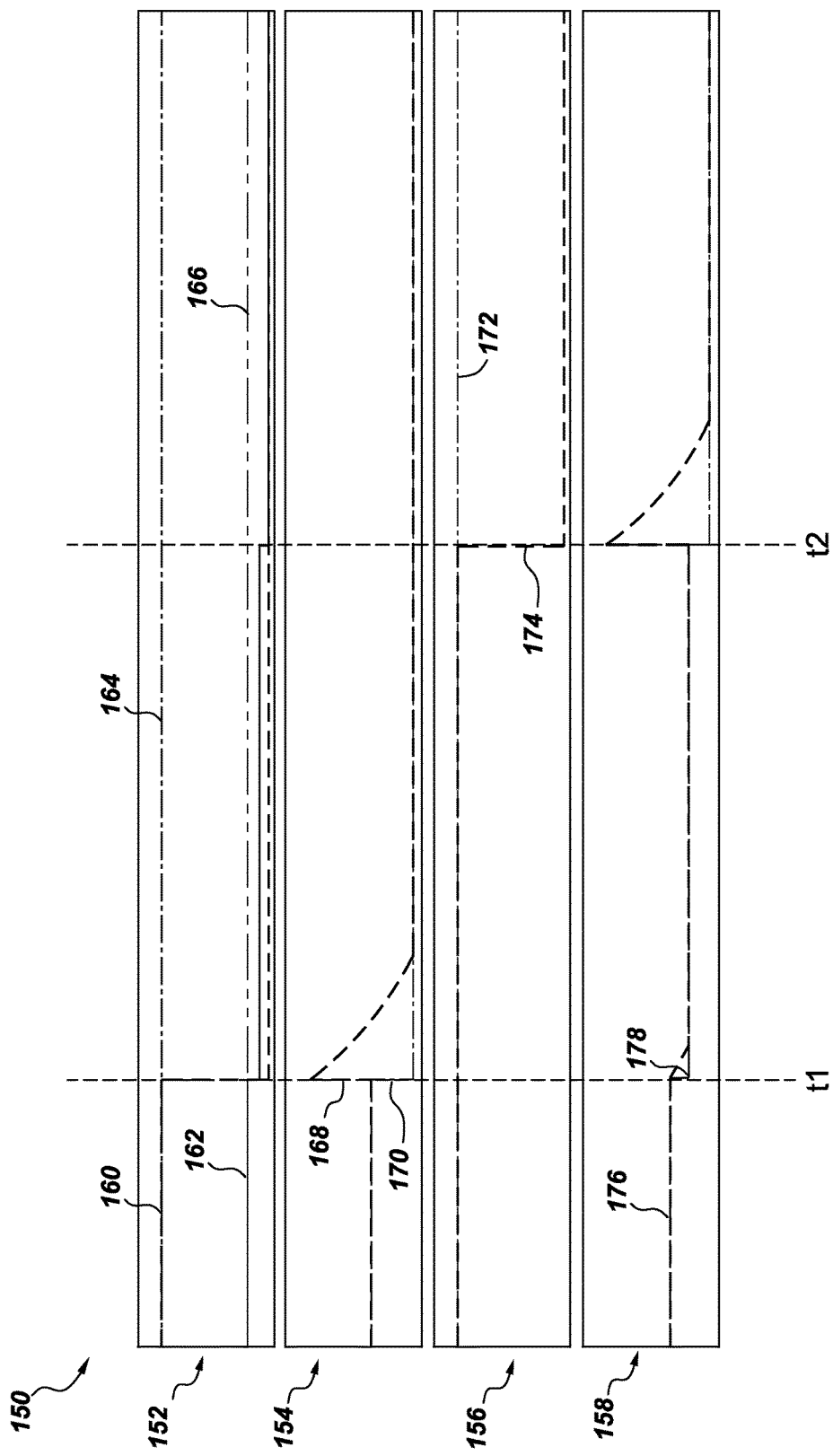
FIG. 3 is a graphical diagram illustrating simulation plots of the DC power system of FIG. 2, in accordance with an embodiment of the present technique.
Figure 4:
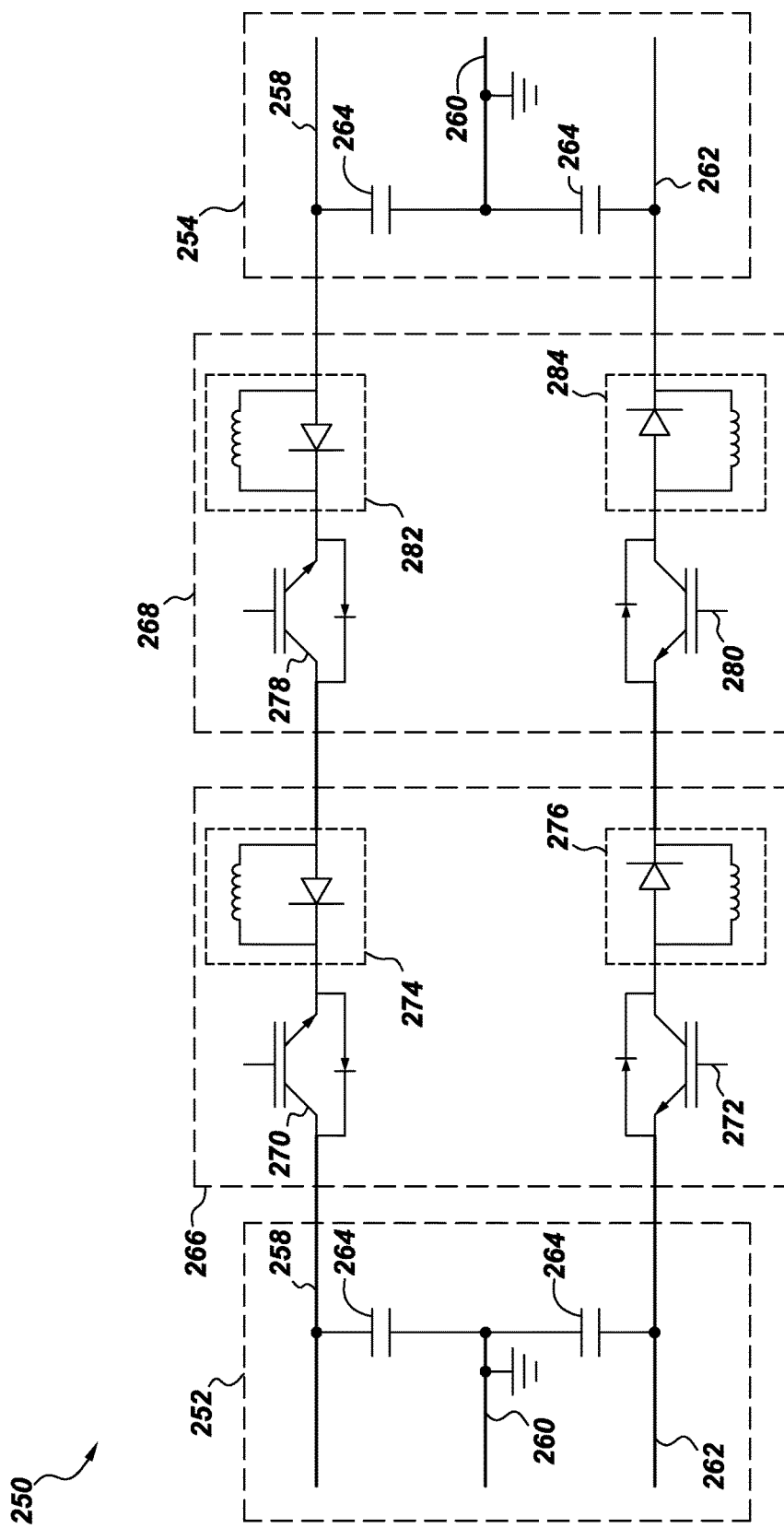
FIG. 4 is a schematic diagram illustrating another DC power system, according to aspects of the present disclosure.

Referring now to FIG. 3, a graphical diagram 150 illustrating simulation plots of the DC power system of FIG. 2 in accordance with an embodiment of the present technique are depicted. The plots shown are for a simulated short circuit faults on positive rail 208 in DC bus subsection 204 at time t1 and on negative rail 212 in DC bus subsection 204 at time t2. In FIG. 4, plot 152 shows four signals, a positive rail voltage signal 160 of faulty DC bus subsystem 204, a load current signal 162 of faulty subsystem 204, a positive rail voltage signal 164 on healthy DC bus subsystem 202, and a load current signal 166 of healthy subsystem 202. As can be seen from plot 152, when the first short circuit fault occurs at time t1, positive rail voltage signal 160 drops to zero and therefore load current signal 162 of the faulty subsystem also drops to half of its original current value. The load current signal 162 further reduces to zero at time t2 when second short circuit occurs and negative rail voltage also becomes zero because of the fault. Also it can be noted that since healthy subsystem is isolated, positive rail voltage signal 164 and load current signal 166 of healthy subsystem do not see any change and continues to operate normally.

Plot 154 in FIG. 3 shows two currents signals, an inductor current signal 168 of positive rail inductor 222 and a positive rail current signal 170 of the faulty subsystem 204. As can be seen, positive rail current signal 170 reduces to zero at time t1 when the short circuit fault occurs on positive rail 208. Furthermore, there is a slight spike in inductor current signal 168 at time t1. After time t1, inductor current signal 168 starts recirculating via positive rail diode 220 and after a while it completely extinguishes.

Plot 156 in FIG. 3 shows, a negative rail voltage signal 172 of healthy subsystem 202 and a negative rail voltage signal 174 of faulty subsystem 202. As can be seen the first fault at time t1 does not affect both voltage signals 172 and 174. However, the second short circuit fault which occurs on negative rail at time t2 affects the negative rail voltage signal 174 which reduces to zero at time t2. Furthermore, plot 158 of FIG. 3 shows an inductor current signal 176 of negative rail inductor 226 and a negative rail current 178 on faulty subsystem 204. At time t1, inductor current signal 176 as well as negative rail current 178 both reduce to half the original value. Further, at time t2, both inductor current signal 176 and negative rail current 178 reduce to zero value. It can be noted that as expected inductor current signal 176 does not reduce to half or zero value immediately at times t1 and t2 respectively, rather it takes a short time before going to zero value. At time t2, subsystem 202 and subsystem 204 are completely isolated.

FIG. 4 illustrates a schematic diagram of another DC bus 250 for use in a DC power system in accordance with aspects of the present disclosure. DC bus 250 includes a DC bus subsection 252 and a DC bus subsection 254. DC bus 250 allows bidirectional power flow i.e., the DC power can flow from either DC bus subsection 252 to DC bus subsection 254 or from DC bus subsection 254 to DC bus subsection 252. DC bus 250 also includes a positive rail 258, a ground rail 260 and a negative rail 262. A plurality of capacitors 264 and loads (not shown) may be connected between the positive rail 258, the ground rail 260 and the negative rail 262. Since DC bus 250 allows bidirectional power flow, two DC bus separators are used in the embodiment of FIG. 4 to the DC power system includes at least two DC bus separators, each configured to isolate the healthy DC bus subsection from the faulty DC bus subsection depending on the direction of the DC bus current.

A first DC bus separator 266 and a second DC bus separator 268 are connected in series in opposite polarity. It should be noted that two DC bus separators 266, 268 are used in this embodiment, as the DC power may flow from either subsection 252 to subsection 254 or vice versa. Furthermore, the reason for connecting the two DC bus separators 266, 268 in opposite polarity is that the current can flow in either direction. Thus, either DC bus separator 266 or DC bus separator 268 may work to protect the system depending on the direction of the DC bus current.

Each of DC bus separators 266 and 268 includes a controllable switch and a diode-inductor pair in its positive rail as well as negative rail. For example, DC bus separator 266 includes controllable switches 270 and 272 and diode-inductor pairs 274, 276 in its positive rail 258 and negative rail 262 respectively. Similarly, DC bus separator 268 includes controllable switches 278 and 280 and diode-inductor pairs 282, 284 in its positive rail 258 and negative rail 262 respectively. DC bus separators 266 and 268 operate similar to DC bus separator 206 of FIG. 2. DC bus separator 266 protects DC bus subsection 252 in case of a fault on DC bus subsection 254 and DC bus separator 268 protects DC bus subsection 254 in case of a fault on DC bus subsection 252.

As an example, for a case where DC power is flowing from DC bus subsection 254 to DC bus subsection 252, during normal operation all controllable switches 270, 272, 278 and 280 are conducting and the DC current flows from the inductors of diode-inductor pairs 282 and 284, controllable switches 270, 272, 278, 280 and diodes of diode-inductor pair 274, 276. When there is a fault 286 on positive rail 258 of DC bus subsection 252, at first the diode of the diode-inductor pair 282 becomes even more reverse biased and then once controllable switch 278 is switched off, the diode of the diode-inductor pair 282 becomes forward biased and provides a freewheeling path for the inductor current of the inductor of the diode-inductor pair 282. Eventually the inductor current extinguishes and DC bus separator 268 isolates positive rail 258 of healthy DC bus subsection 254 from positive rail 258 of faulty DC bus subsection 252.

One of the advantages of the present system is high system availability via a more fault tolerant conversion structure based on splitting of the DC link of power converters. The system provides a simple arrangement without varistors for isolation between two subsections of the DC common DC bus.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A direct current power system comprising:
a plurality of energy sources supplying power to a plurality of loads;
a common direct current (DC) bus having at least one positive rail, the common DC bus coupled between the plurality of energy sources and the plurality of loads, wherein the common DC bus comprises:
at least two DC bus subsections with DC power transfer capability therebetween;
at least one DC bus separator coupled between the at least two DC bus subsections, wherein the DC bus separator comprises:
at least one positive rail controllable switch with at least one of its terminals coupled with at least one terminal of a positive rail inductor to provide a current path between the at least two DC bus subsections during normal operation via the positive rail inductor, wherein the at least one positive rail controllable switch is controlled to be switched off to break the current path when a fault on the positive rail is detected;
at least one positive rail diode connected in parallel to the at least one positive rail inductor and arranged to provide a circulating current path to dissipate an inductor current in the at least one positive rail inductor when the at least one positive rail controllable switch is switched off.

2. The DC power system of claim 1, wherein the plurality of loads include marine or subsea equipment.

3. The DC power system of claim 1, wherein the plurality of energy sources include generators, energy storage devices, power grid or combinations thereof.

4. The DC power system of claim 1, wherein the positive rail controllable switch comprises a switching device based on semiconductor technology.

5. The DC power system of claim 4, wherein the switching device include an insulated gate bipolar transistor (IGBT), a metal oxide semiconductor field effect transistor (MOSFET), a field effect transistor (FET), a gate turn-off thyristor, an insulated gate commutated thyristor (IGCT), an injection enhanced gate transistor (IEGT), a silicon carbide based switch, a gallium nitride based switch, a gallium arsenide based switch, or equivalents thereof.

6. The DC power system of claim 1, wherein the positive rail controllable switch comprise a plurality of switching devices connected in series or in parallel or combinations thereof.

7. The DC power system of claim 1, wherein the common DC bus includes a negative rail or a ground rail or combinations thereof.

8. The DC power system of claim 7, wherein the DC bus separator further includes a negative rail controllable switch having at least one of its terminals coupled with at least one terminal of a negative rail inductor to provide the current path between the at least two DC bus subsections during normal operation via the negative rail inductor, wherein the negative rail controllable switch is controlled to be switched off to break the current path when a fault on the negative rail is detected.

9. The DC power system of claim 8, wherein the DC bus separator further includes a negative rail diode connected in parallel to the negative rail inductor and arranged to provide a circulating current path to dissipate an inductor current in the negative rail inductor when the negative rail controllable switch is switched off.

10. The DC power system of claim 9, wherein the common DC bus is configured for unidirectional power flow or bidirectional power flow.

11. The DC power system of claim 10, wherein when the common DC bus is configured for bidirectional power flow, the DC power system includes at least two DC bus separators connected in series with opposite polarity, each DC bus separator configured to isolate the healthy DC bus subsection from the faulty DC bus subsection depending on the direction of the DC bus current.

12. The DC power system of claim 7, wherein a plurality of DC capacitors are connected between the positive and the negative rail or between the ground rail and the positive rail or between the ground rail and the negative rail of the DC bus.

13. The DC power system of claim 7, wherein the plurality of loads are connected between the positive rail and the negative rail or between the positive rail and the ground rail or between the negative rail and the ground rail.

14. A method of supplying direct current (DC) power comprising:
providing a plurality of energy sources to supply DC power to a plurality of loads;

coupling the plurality of energy sources and the plurality of loads by a common DC bus having at least one positive rail, wherein the coupling comprises:
   providing at least two DC bus subsections with DC power transfer capability therebetween;
   coupling at least one DC bus separator between the at least two DC bus subsections, wherein coupling the at least one DC bus separator comprises:
      coupling at least one terminal of a positive rail to at least one terminal of a positive rail inductor to provide a current path between the at least two DC bus subsections during normal operation via the positive rail inductor;
      controlling the at least one positive rail controllable switch to be switched off to break the current path when a fault on the positive rail is detected;
      connecting at least one positive rail diode in parallel to the at least one positive rail inductor and arranged to provide a circulating current path to dissipate an inductor current in the at least one positive rail inductor when the at least one positive rail controllable switch is switched off.

15. The method of claim 14 further comprising providing a negative rail or a ground rail or both in the common DC bus.

16. The method of claim 15 further comprising coupling one terminal of a negative rail controllable switch to one terminal of a negative rail inductor to provide the current path between the at least two DC bus subsections during normal operation via the negative rail inductor.

17. The method of claim 16 further comprising controlling the negative rail switch to be switched off to break the current path when a fault on the negative rail is detected.

18. The method of claim 17 further comprising connecting a negative rail diode in parallel to the negative rail inductor and arranged to provide a circulating current path to dissipate an inductor current in the negative rail inductor when the negative rail controllable switch is switched off.

19. The method of claim 18 comprising providing at least two DC bus separators connected in series with opposite polarity when the common DC bus is configured for bidirectional power flow, each DC bus separator configured to isolate the healthy DC bus subsection from the faulty DC bus subsection depending on the direction of the DC bus current.

20. The method of claim 15 comprising connecting a plurality of DC capacitors between the positive and the negative rail or between the ground rail and the positive rail or between the ground rail and the negative rail of the DC bus.

21. The method of claim 15 comprising connecting the plurality of loads between the positive rail and the negative rail or between the positive rail and the ground rail or between the negative rail and the ground rail.

22. The method of claim 14, wherein providing DC power to the plurality of loads comprises providing DC power to marine or subsea equipment.

* * * * *